(12) United States Patent
Toshiyuki et al.

(10) Patent No.: US 7,176,706 B2
(45) Date of Patent: Feb. 13, 2007

(54) CAPACITANCE MEASUREMENT METHOD OF MICRO STRUCTURES OF INTEGRATED CIRCUITS

(75) Inventors: Matsumoto Toshiyuki, Sanda (JP); Yakabe Masami, Amagasaki (JP); Hirota Yoshihiro, Kyoto (JP)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 11/145,964

(22) Filed: Jun. 7, 2005

(65) Prior Publication Data

US 2005/0225350 A1    Oct. 13, 2005

Related U.S. Application Data

(62) Division of application No. 09/703,845, filed on Nov. 2, 2000, now Pat. No. 6,906,548.

(51) Int. Cl.
*G01R 31/26* (2006.01)

(52) U.S. Cl. ................................. 324/765
(58) Field of Classification Search ........... 324/769, 324/765, 767, 158.1; 257/48, 268, 335; 365/174, 365/149; 438/14–18
See application file for complete search history.

(56) References Cited

U.S. PATENT DOCUMENTS

| | | |
|---|---|---|
| 3,753,373 A | 8/1973 | Brown |
| 4,473,796 A | 9/1984 | Nankivil |
| 4,498,044 A | 2/1985 | Horn |
| 5,365,477 A | 11/1994 | Cooper et al. ............. 365/174 |
| 5,416,470 A | 5/1995 | Tanaka et al. |
| 5,451,806 A | 9/1995 | Davies ....................... 257/370 |
| 5,701,101 A | 12/1997 | Weinhardt et al. |
| 5,808,516 A | 9/1998 | Barber |
| 5,886,529 A | 3/1999 | Wakamatsu |
| 5,986,456 A | 11/1999 | Yamashita |
| 6,054,867 A | 4/2000 | Wakamatsu |
| 6,069,485 A | 5/2000 | Long et al. ................. 324/769 |
| 6,295,630 B1 | 9/2001 | Tamegaya ..................... 716/4 |
| 6,437,360 B1 | 8/2002 | Cho et al. ..................... 257/10 |
| 6,456,105 B1 * | 9/2002 | Tao ............................ 324/769 |

FOREIGN PATENT DOCUMENTS

| | | |
|---|---|---|
| DE | 3413849 | 8/1985 |
| DE | 4135991 C1 | 12/1992 |
| JP | 61-014578 | 1/1986 |
| JP | 06180336 | 6/1994 |
| JP | 9-280806 | 10/1997 |

OTHER PUBLICATIONS

*An On-Chip Attofarad Interconnect Charge-Based Capacitance Measurement (CBCM Technique)*, J.C. Chen, B.W. McGaughy, D. Sylvester, C. Hu, Department of EECS, University of California Berkeley, 1996.

(Continued)

*Primary Examiner*—Ha Tran Nguyen
*Assistant Examiner*—Tung X. Nguyen
(74) *Attorney, Agent, or Firm*—Barnes & Thornburg LLP (57) ABSTRACT

The present invention is a method of measuring capacitance of micro structures in an integrated circuit wherein the micro structure includes a first terminal and a second terminal separated by an insulator and at least a third terminal separated from the first terminal by an insulator. The method comprises applying biasing voltage to the second terminal and applying the same potential to the first and third terminals. An electrical characteristic between the first and second terminals are measured to determined the capacitance between the first and second terminals.

3 Claims, 13 Drawing Sheets

OTHER PUBLICATIONS

*On-Chip Measurement of Interconnect Capacitances in a CMOS Process*, A. Khalkhal and P. Nouet, Laboratoire d'Informatique, de Robotique et de Microelectronique de Montpellier (LIRMM), Proc. IEEE 1995 Int. Conference on Microelectronic Test Structures, vol. 8, Mar. 1995.

*Efficient extraction of metal parasitic capacitances*, G. J. Gaston and I.G. Daniels, GEC Plessey Semiconductors Ltd., Proc. IEEE 1995 Int. Conference on Microelectronic Test Structures, vol. 8, Mar. 1995.

*Op-amp circuit measures diode-junction capacitance*, by D. Monticelli and T. Frederiksen, Engineer's notebook, Electronics, Jul. 10, 1975.

* cited by examiner

CAPACITANCE MEASUREMENT METHOD OF MICRO STRUCTURES OF INTEGRATED CIRCUITS

CROSS REFERENCE

This application is a divisional application of U.S. patent application Ser. No. 09/703,845, filed Nov. 2, 2000, now U.S. Pat. No. 6,906,548, which is incorporated herein by reference.

BACKGROUND AND SUMMARY OF THE INVENTION

The present invention relates generally to capacitance measurements and more specifically to the method of measuring capacitance of micro structures in an integrated circuit.

The capacitance of micro structures of an integrated circuit are in the range of femto-farads These capacitance's are between conductors or interconnects on an integrated circuit as well as the parasitic capacitance between regions of the integrated circuit at their PN junctions and between the regions and the conductors or interconnects. Micro structures or elements may include LSI, DRAM or ROM or other arrays. They may also include individual elements of these arrays, for example, a field effect transistor, word-line, bit-line, access transistor structure, cell plate, memory capacitor ETC.

Historically, there was no way to measure the actual capacitance between micro elements. In order to determine very small capacitance and examine the integrated circuits, the prior art made multiple number models of the integrated circuits. The number of models were between 100–1000 models.

A method for parasitic interconnect capacitor measurements with 0.01 fF or 10 af sensitivity using an efficient test structure on a chip is described in An On-chip, Attofarad Interconnect Charge-Based Capacitive Measurement (CBMC) Technique by James C. Chen et al., 0-7803-3393-4/96 IEEE. The on-chip structure technique were used to measure interconnect geometry capacitance between two crossing metals as well as metal capacitance over a silicon substrate.

The present invention is a method of measuring capacitance of micro structures in an integrated circuit wherein the micro structure includes a first terminal and a second terminal separated by an insulator and at least a third terminal separated from the first terminal by an insulator. The method comprises applying biasing voltage to the second terminal and applying the same potential to the first and third terminals. An electrical characteristic between the first and second terminals are measured to determined the capacitance between the first and second terminals. The integrated circuit may include a plurality of third terminals, each separated from the first terminal by an insulator. The method would further include applying the same potential to the first terminal and all the third terminals so as to measure only the capacitance between the first and second terminals.

The integrated circuit may also include a fourth terminal separated from the first terminal by an insulator. The method may include applying the biasing voltage to the second and fourth terminals and measuring the voltage between the first terminal and the second and fourth terminals. This determines the sum of the capacitance between the first terminal and the second and fourth terminals. Although the first and third or fourth terminals are connected to the same potential, the measurements are taken at the first terminal.

Wherein the micro structure is a field affect transistor, the capacitance between the gate and the source or drain may be measured by applying the biasing voltage to one of the source and drain and applying the same potential to the gate and to the channel area and the other of the source and drain. Then the electrical characteristic is measured between the gate and one of the source and drain to determine the capacitance between the gate and one of the source and drain. Alternatively, the capacitance between the gate and one of the source and drain can be measured by biasing the gate and applying the same potential to the source and to the drain. The biasing voltage may be connected to both the source and drain with the gate and the body connected to the same potential. This would produce the sum of the capacitance between the gate and the source and drain.

The capacitance of the PN junction between the source and drain and the body may also be measured. This would include applying the biasing voltage to the body and applying the same voltage to one of the source or drain and to the gate and the other to the source and drain. The electrical characteristics between the selected one of the source or drain and the body is measured to determine the capacitance of the PN junction therebetween. In an insulated gate field effect transistor, the channel area has applied the biasing voltage and the gate source and drain have the same potential. The voltage between the gate and the channel is measured to determine the capacitance between the gate and the channel through the gate insulator.

Wherein the integrated circuit includes a memory array of cells wherein each cell has a cell plate, transistor connected to a word line and a bit line and a body, the capacitance of the various micro structures may be measured. The capacitance between the neighboring lines may be measured by biasing a bit or word line and applying the same potential to a neighboring bit or word line and to the cell plate and the body. Then an electrical characteristic between the word or bit line and its other neighbor word or bit line is measured to determine the capacitance therebetween. By biasing a pair of neighbor bit or word lines, the sum of the capacitance between the bit or word line and both of its neighbors may be measured. Preferably, the access transistor of the cells and the bit or word line drives and switches are turned off.

The method also includes providing a pad on the integrated circuit connected to the bit or word line and a separate pad for the cell plate and the body. A shield of electrodes are also provided on the integrated circuit adjacent the pad for being connected to the same potential as the word or bit line.

The same method may be used to determine the capacitance between a conductor and its neighboring conductor separated by insulators. This is between conductors on the same level and on different levels of the integrated circuit.

Other objects, advantages and novel features of the present invention will become apparent from the following detailed description of the invention when considered in conjunction with the accompanying drawings.

DETAILED DESCRIPTION OF THE PREFERRED EMBODIMENTS

The present method takes advantage of the instruments capable of measuring very small capacitance, for example, in the femto-farad range ($10^{-15}$). The ability to measure discreet capacitance in an integrated circuit surrounded by other stray or parasitic capacitance is achieved by the present method. Integrated circuits have many conductors, interconnects, terminals and other conductor structure separated from each other by an insulator. They may be in the same plane or level or different planes or levels. The capacitance between a conductor and an active portion of the substrate are separated by insulators and therefore have capacitance therebetween. The PN junctions within the substrate also exhibit capacitance. Each of these may be isolated and measured by the present method.

The two elements which can form the terminals of a capacitor with a dielectric or insulator therebetween are connected to a measuring or sensing terminal and a biasing voltage terminal. All other elements are connected to another terminal which has the same potential as the measuring/sensing terminal. This effectively cancels all capacitances connected to the third terminal which has the same potential as the measuring terminal and isolates the capacitance to be measured between the measuring or sensing terminal and the biasing terminal. Since the measuring or sensing terminal is at the same potential as the third terminal, the voltage across any capacitance between the sensing/measuring terminal and the third terminal will be zero. Thus, there is no charge that can accumulate on any capacitor which would be formed between the element connected to the measuring/sensing terminal and the third terminal.

While other methods may have tried to measure a specific capacitance, they cannot truly isolate and measure a specific capacitance in the integrated circuit since they did not eliminate parasitic or other capacitance which would occur within the integrated circuit.

The following are examples of methods of measuring capacitance in components as well as a variety of structures of an integrated circuit. They are merely examples to illustrate the present method. The capacitors shown in the diagrams in solid are active capacitance based on the biasing. Those which are nullified are in dashed lines. These examples are not a complete list of the type of integrated circuits that the present method can be used to measure.

Figure 5:
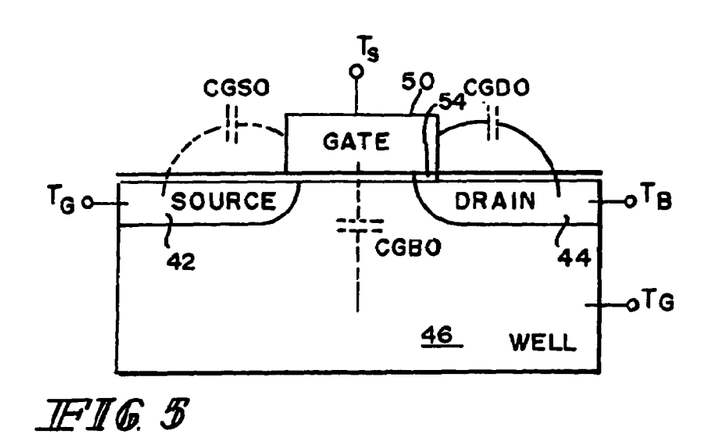
FIG. 5 is an illustration of a method for measuring the capacitance between the gate and the drain.
Figure 6:
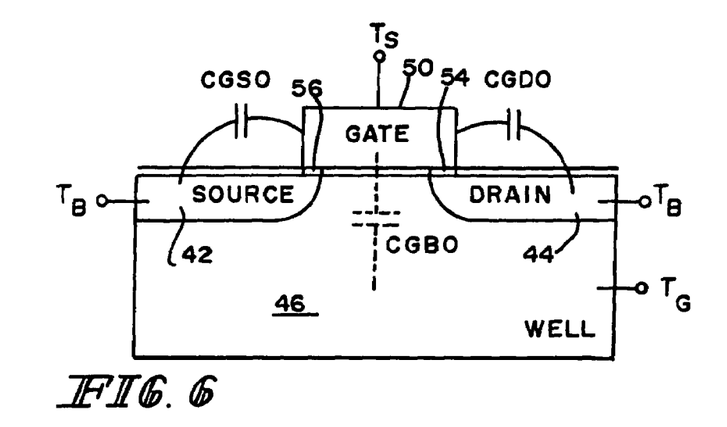
FIG. 6 is an illustration of measuring the capacitance between the gate and the source and drain.
Figure 7:
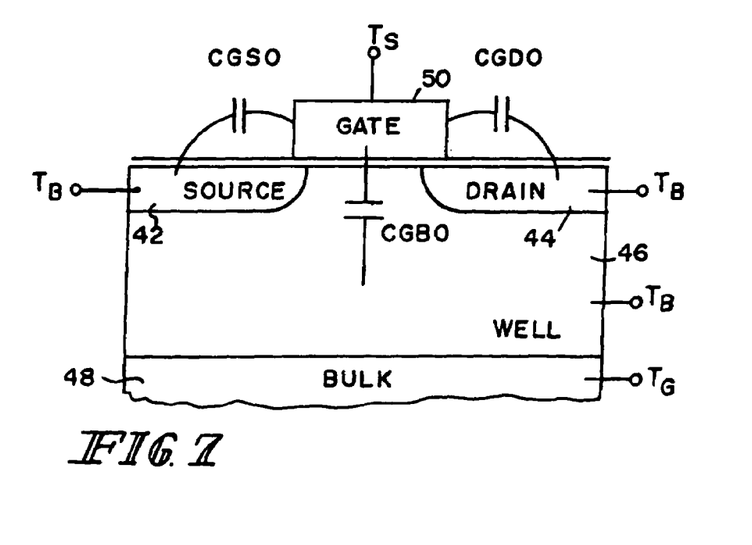
FIG. 7 is a diagram illustrating the method of measuring the capacitance between the gate and the source, drain and well.

The example illustrated in FIGS. 1–9, measure the capacitances of a field effect transistor. A primary example is measuring the capacitance between the gate and one or more of the source, the drain and the channel region or well. A further example is measuring the junction capacitance between the drain or source and the well. The junction capacitance can also be measured in junction field effect transistors, bipolar transistors or any other PN junction device on the integrated circuit. It should also be noted that the well or body of the transistor is not to be limited to a well in a substrate, it may also be the substrate or bulk material. The only distinction of the well being a well on bulk material is illustrated in FIG. 7, wherein the total capacitance of the gate material is measured.

As illustrated in FIGS. 1–9, an insulated gate field effect transistor 40 includes a source 42 and a drain 44 formed in a body or well 46. The channel portion 47 of the well 46 extends between the source 42 and the drain 44. The gate 50 is separated from the source 42, drain 44 and the channel 47 by an insulative layer 52, generally oxide. The gate oxide includes a portion 54 which separates the gate 50 from the drain 44, a portion 56 which separates the gate 50 from the source 42, and a portion 58 which separates the gate 50 from the channel region 47.

Figure 1:
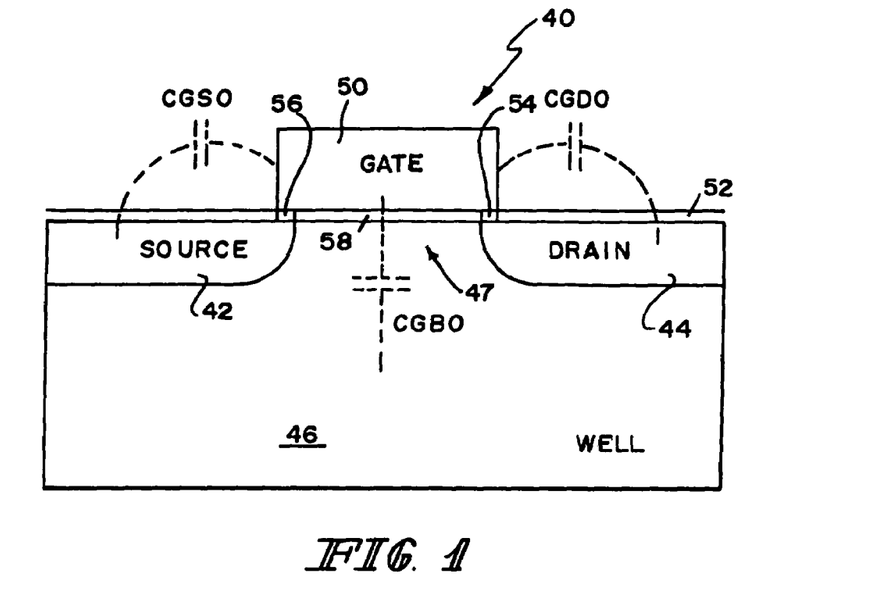
FIG. 1 is a cross section of a field effect transistor showing the capacitance between the gate and the source, drain and body regions.
Figure 2:
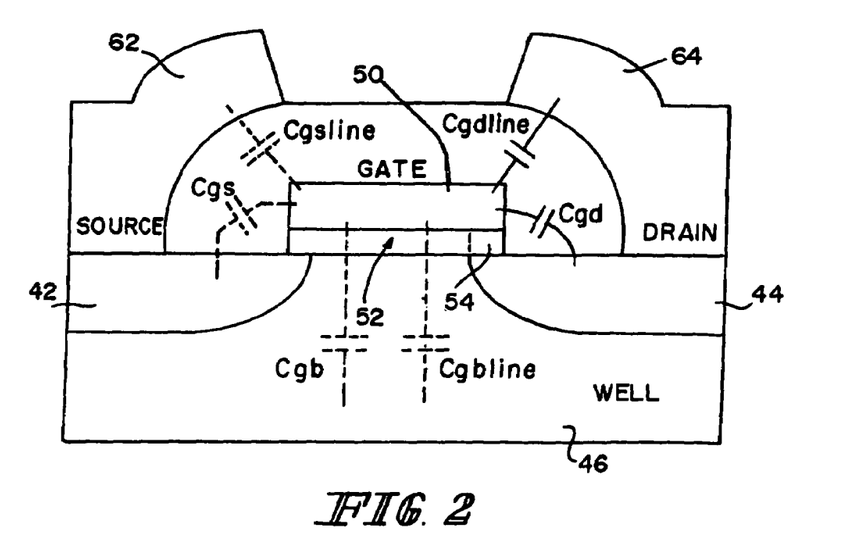
FIG. 2 shows the insulated field effect transistor with the contact and interconnect or line capacitances and biased for gate to drain capacitance measurement.
Figure 3:
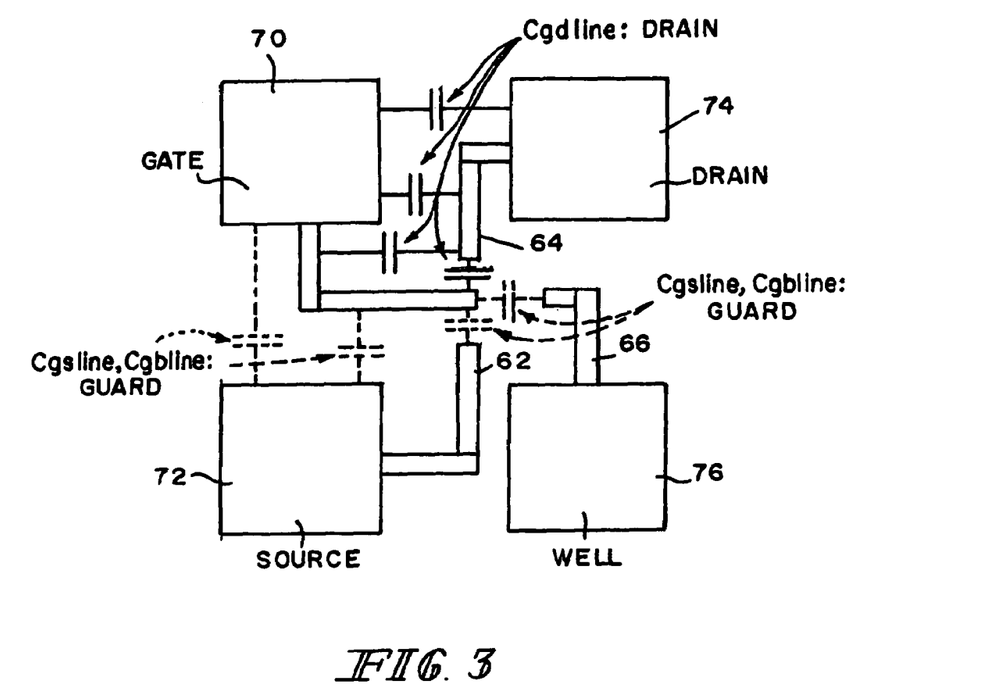
FIG. 3 is a plan view of the line, contacts and interconnects of FIG. 2.
Figure 4:
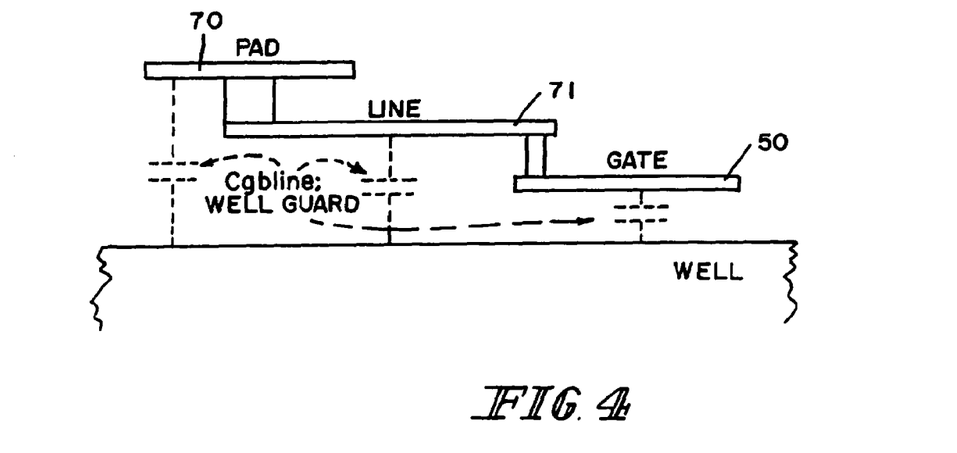
FIG. 4 is a side view of the gate, line and contact pad of FIG. 2.

As illustrated in FIGS. 2–4, the source contact 62, drain contact 64, well contact 66 and gate 50 are connected to respective source pad 72, drain pad 74, well pad 76 and gate pad 70. The contacts and gate may be metal or polysilicon. As shown in FIG. 4, the gate 50 and the gate pad 70 are in two different levels and interconnected by a line 71 in an intermediate level.

For the field effect transistor 40, the capacitance between the gate 50 and the source 42 through the insulator region 56 is signified as CGSO. Similarly, the capacitance between the gate 50 and the drain 44 through insulator region 54 is designated CGD0 and the capacitance between the gate 50 and the channel region 47 of the well 46 through insulator region 58 is signified by CGBO. As illustrated in FIG. 2, the capacitance between the gate 50 and gate line 71 and pad 70 and the source line 62 and pad 72 is signified as Cgsline. Similarly, the capacitance between the gate 50 and gate line 71 and pad 72 and the drain line 64 and drain pad 74 is signified by Cgdline. The capacitance between the gate 50 and gate line 71 and gate pad 70 and the line 66 and pad 76 for the well or body is signified by Cgbline. A plan view in FIG. 3 illustrates the capacitance between the interconnect and contact.

To measure the capacitance between the gate 50 and drain 44, the gate 50 is connected to a sense terminal $T_S$ and the drain 44 is connected to a bias terminal $T_B$. To nullify the capacitance between the gate 50 and the well 46 and between the gate 50 and the source 42, the source 42 and the well 46 are connected to a guard terminal $T_G$ which is at the same potential as the sense terminal $T_S$. Resulting effects on the capacitance are illustrated in FIGS. 3–5. This nullifies the capacitance through the insulators for the source 42 and well 46 regions as well as the capacitance between their contacts, lines, and pads. Only the capacitance between the lines Cgdline and the gate and drain are shown in solid. The other capacitance are shown in dotted line.

An electrical characteristic is measured between the sense terminal $T_s$ and the bias terminal $T_B$ to determine the capacitance therebetween. The impedance or charge can be measured. Knowing the voltage applied across the two terminals, the capacitance can be determined from the measure impedance or charge.

As illustrated in FIG. 6, to measure the sum of the capacitance between the gate 50 and the source 42 and drain 44, the gate 50 is connected to the sense terminal $T_S$, the source 42 and the drain 44 are connected to bias terminal $T_B$ and the well or body 46 is connected to the guard terminal $T_G$ which is the same voltage or potential sense terminal $T_S$.

As illustrated in FIG. 7, to measure the total capacitance between the gate 50 and the source 42, drain 44, and well or body 46, the gate 50 is connected to the sense terminal $T_S$ and the source 42, drain 44 and well 46 are connected to the bias terminal $T_B$. The bulk 48 is connected to the guard terminal $T_G$ which is at the same potential as $T_S$. This is where the well 46 is formed in or on a bulk or substrate 48. This is to remove any capacitance between the bulk 48 and any of the interconnects or contacts of the gate 50, the source 42, the drain 44 and the well 46.

Figure 8:
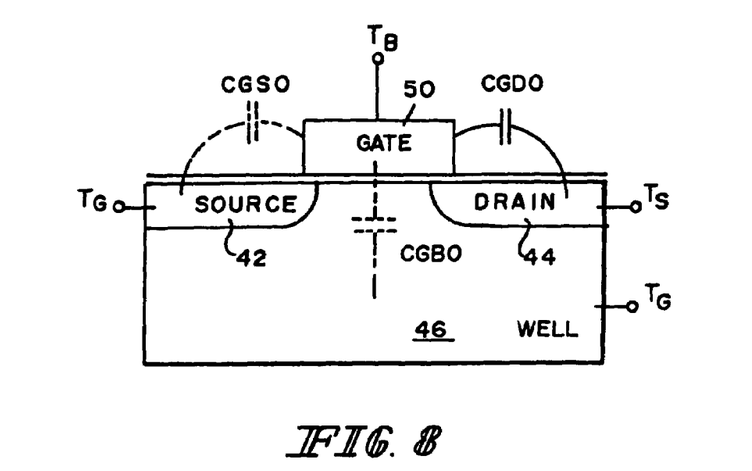
FIG. 8 is an illustration of another method of measuring the capacitance between the gate and the drain.

The measurements with respect to FIGS. 1–7 are not polarity specific. Thus, for example, as illustrated in FIG. 8, the capacitance between the gate 50 and the drain 44 may be measured using the present method wherein the drain 44 is connected to the sense terminal $T_S$ while the gate 50 is connected to the bias terminal $T_B$. The source 42 and the well 46 are connected to the guard terminal $T_G$ which is at the same potential as the sense terminal $T_S$ connected to drain 44.

Figure 9:
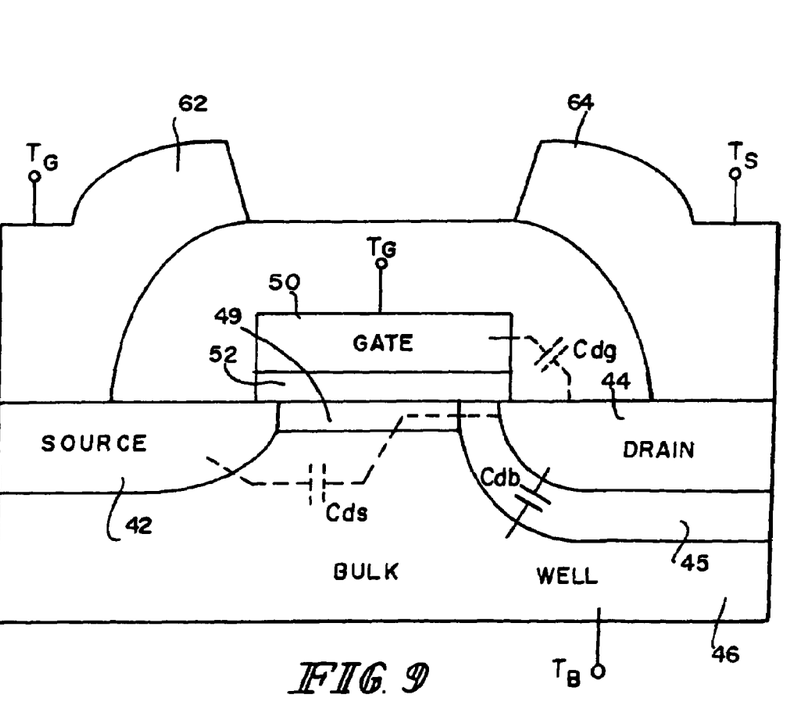
FIG. 9 illustrates the method of measuring the junction capacitance between the drain and the well.

The capacitance to be measured may also be the capacitance of a PN junction. As illustrated in FIG. 9, the capacitance Cdb of the PN junction between the drain 44 and the well, bulk or body 46 is to be measured. The drain 44 is connected to the sense terminal $T_S$ and well 46 is connected to the bias terminal $T_B$. The gate 50 and the source 42 are connected to the guard terminal $T_G$ which is at the same potential as a drain 44 at the sense terminal $T_S$. With this appropriate biasing, a depletion region 45 is produced between the drain 44 and the body 46. Also, a depletion region 49 is formed in the channel region 47 of the well 46 extending between the source 42 and the drain 44. Since the gate 50 is at the same potential or voltage as the drain 44, the drain to gate capacitance Cdg will not be sensed nor the drain to source capacitance Cds through the depletion layer 49 in the channel 47. The only capacitance to be measured or sensed is the capacitance Cdb through the depletion layer 45 between the drain 44 and the well 46. The depletion layer 45 may be considered an insulative layer or dielectric of a capacitor. The capacitance of other PN junctions may be measured, for example, in a junction field effect transistor, bipolar transistor or any other PN junction in an integrated circuit.

Measurements were made on a insulated gate field effect transistor having a gate length of two microns, a width of 50 microns and an oxide thickness of 50 nanometers. The measured capacitance between the gate and drain was measured at 17.8 fF or 0.356 fF per micron. The capacitance between the gate and source was measured to be 16.3 fF or 0.326 fF per micron. The combined capacitance between the gate and the source and drain was measured at 34.4 fF. Based on conventional methods, the capacitance between the gate and drain or the gate and source was calculated to be 0.35 fF per microns. Thus, by direct measurements, the difference between the gate drain and gate source capacitance can be measured.

The biasing may be, for example, ground or any other bias voltage. The measurements were made with the CS8800 instrument available from Sumitomo Metals. This is but an example, and other instruments may be used to make the measurements, for example capacitance-voltage converter and capacitance-frequency converter.

Another example of measuring capacitance of an integrated circuit will be described with respect to a memory array. The bit line capacitance measurements will be described in FIGS. 10 and 15 while the word line capacitance measurements will be described with respect to FIGS. 16–21. The historically complicated test structure were provided on the memory of array structure. They consumed large areas. Also, they only yield pico-farad resolution capabilities. Estimates of capacitance have also been by simulating using 2D and 3D simulations to give femto-farad resolutions.

Figure 10:
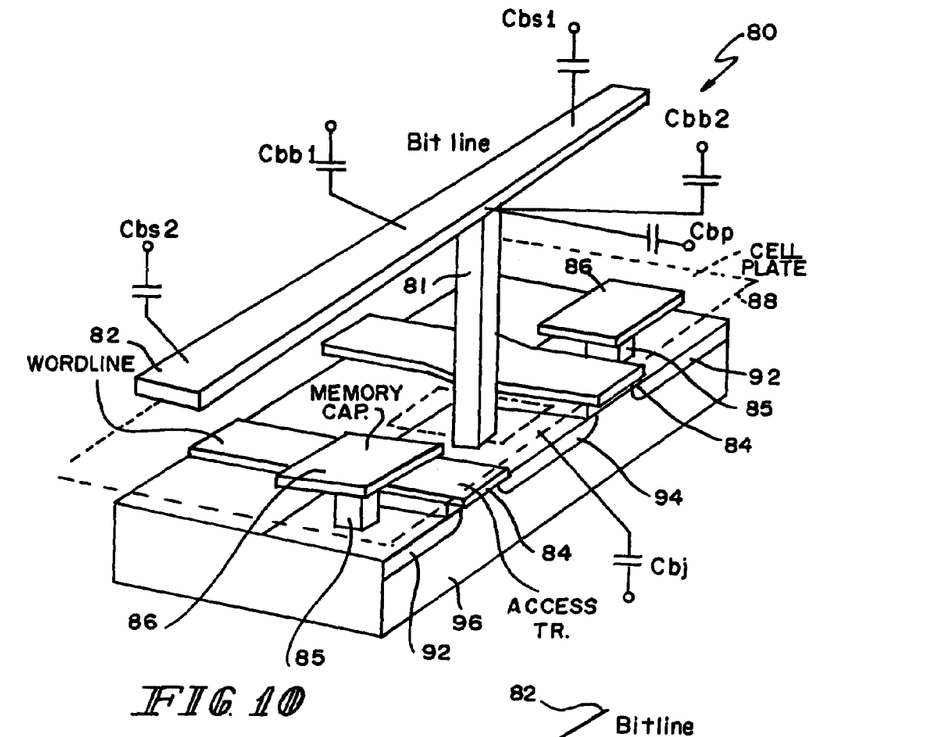
FIG. 10 is a perspective view of a memory array with a capacitance related to the bit line.
Figure 11:
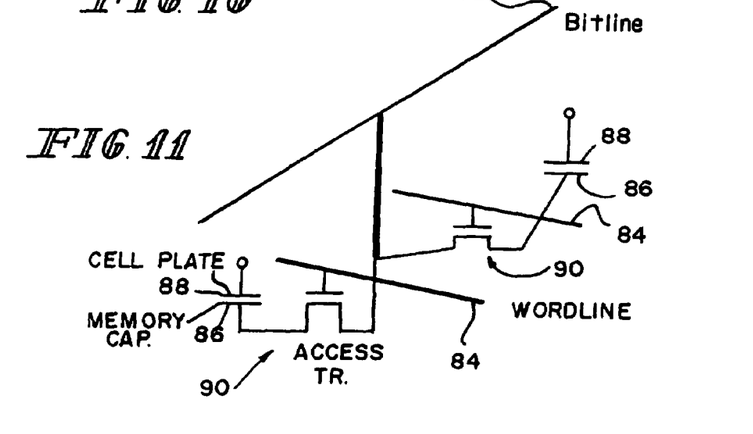
FIG. 11 is a schematic of the array of FIG. 10.

An example of a portion of a memory is illustrated in FIGS. 10 and 11. Each cell includes a transistor 90 having its drain 94 connected to the bit line 82 and its gate connected to or formed by the word line 84. Connected to the source 92 is a first plate 86 of memory capacitor having as a second plate, a common cell plate 88. The source 92 and the drain 94 of the transistor are formed in a bulk, body or well 96. The bit line 82 is connected by via 81 to the drain 94. The drain 94 is a common drain for a pair of adjacent access transistors 90. Via 85 connects the source 92 to the memory capacitor plate 86. The cell plate 88 is shown in phantom and is separated from the lower capacitor plates 86 by an insulator or dielectric.

The bit line capacitances are illustrated in FIG. 10. The inter-bit line capacitance Cbb1 and Cbb2 is a capacitance between the bit line and its neighboring bit lines. These are in the same plane or interconnect level. The capacitance between the bit line 82 and the cell plate 88 is signified by Cbp. The junction capacitance of the access transistor 90 is signified by Cbj. The junction capacitance of the switching transistors on the bit line namely for the sense amplifier loading and the precharging loading, are represented by Cbs1 and Cbs2, respectively. Although these switching transistors are off during any measurement, there is a resulting junction capacitance because of the biasing of their wells. Because the cell plate 88 is between the bit line 82 and the word lines 84 and also between the bit line 82 and the body or bulk 96, these capacitances do not occur.

Figure 12:
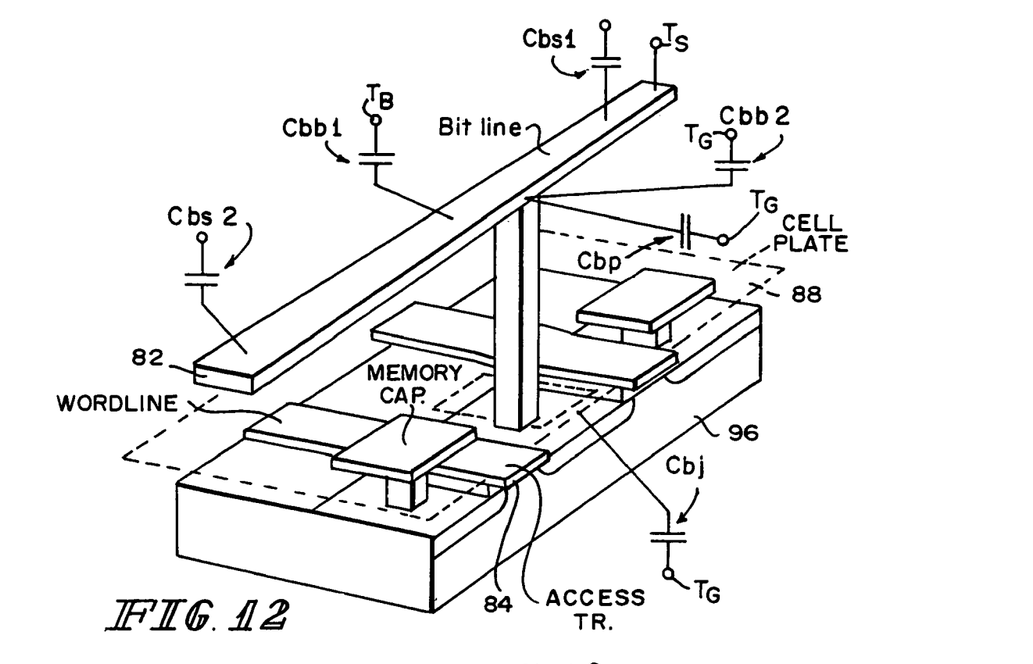
FIG. 12 illustrates a method of measuring the capacitance between a pair of neighboring bit lines.

The measurement of the capacitance between bit line 82 and its first neighbor 1 (not shown) is illustrated in FIG. 12. The access transistors 90 and the switching transistors on both ends of the bit line are turned off. The sensing voltage or $T_S$ is applied to the bit line 82. The neighboring bit line 1 is connected to the biasing voltage $T_B$. The neighboring bit line 2, cell plate 88 and the bulk 96 of the access transistors are all connected to the guard voltage $T_G$ which is the same voltage as the sense voltage $T_S$. Thus, the capacitance between $T_S$ and $T_B$ include the capacitance between bit line and its neighbor 1 Cbb1 and the junction capacitance Cbs1 and Cbs2 for the switched transistors.

Figure 13:
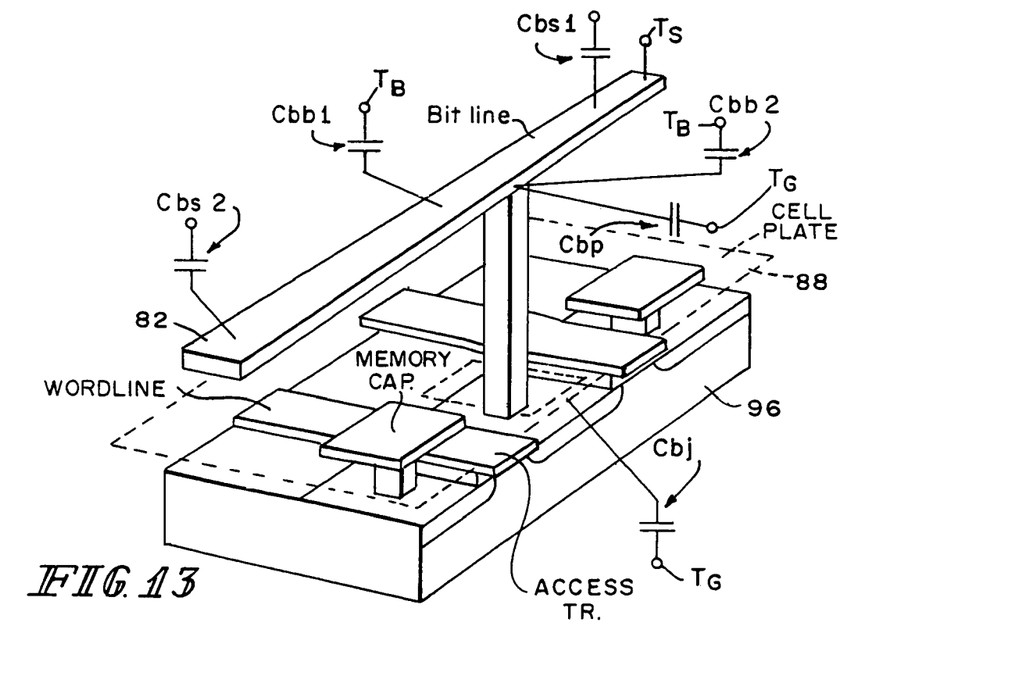
FIG. 13 illustrates a method of measuring the capacitance between three neighboring bit lines.

The measurement of the capacitance between the bit line 82 and both of its neighbors is illustrated in FIG. 13. Bit line 82 is connected to the sensed terminal $T_S$ and both neighboring bit lines are connected to the bias terminal $T_B$. Cell plate 88 and the bulk 96 of the transistors are connected to the guard terminal $T_G$. They have the same voltage applied as to the sensed terminals $T_S$. The resulting capacitance is the sum of the capacitance to the adjacent or neighboring bit lines Cbb1 and Cbb2 and the switched transistors junction capacitance Cbs1 and Cbs2.

Figure 14:
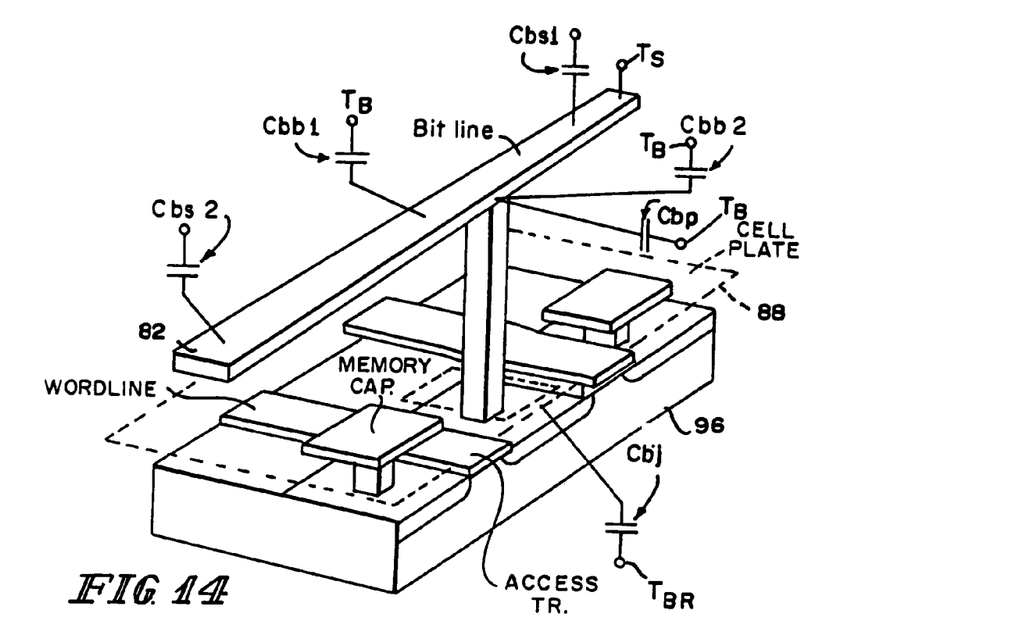
FIG. 14 illustrates measuring the total capacitances related to a bit line.

The measurement of the capacitance between the bit line and all of their elements in the integrated circuit is illustrated in FIG. 14. The bit line is connected to the sensed terminal $T_S$. The neighboring bit lines and the cell plate are connected to the bias terminal $T_B$. The bulk body or well 96 is also connected to a biasing voltage terminal $T_{BR}$ or which indicates that it is reversed bias with respect to the bit line to produce the depletion region to obtain a junction capacitance.

Figure 15:
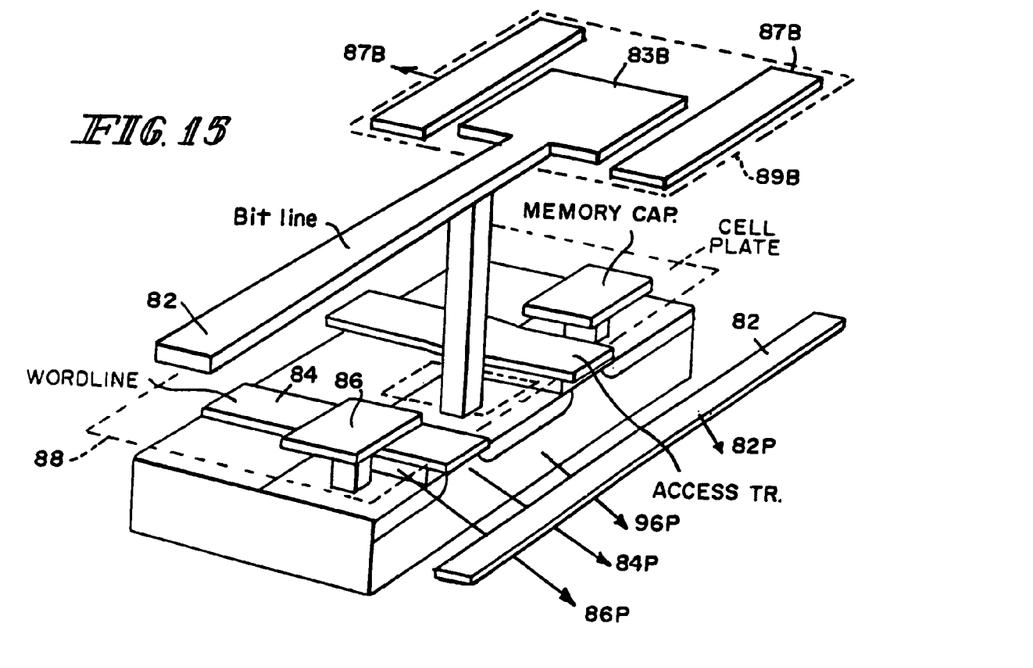
FIG. 15 illustrates the pad and guard structure for bit line measurement.

FIG. 15 illustrates a measuring pad 83 connected to the bit line 82. A pair of guard or shield strips 87 are provided adjacent the pad 83B on the same plane or interconnect level. A shield plate 89B is provided below the pad 83B and the shield strips 87 at a different level to segregate the pad 83B for the remainder of the integrated circuit. The shield strips 87B and the pad 89B are connected to the guard terminal $T_G$ to isolate the pad 83 and prevent it from affecting or creating any parasitic capacitance in the integrated circuit during the testing. The structures 83B, 87B and 89B are provided on the integrated circuit for tests or measurement purposes. The arrows indicate independent connections for the capacitor cell plate 86P, word line 84P, the body bulk or well region 96P and the neighboring word line 82P.

The number of pads and shielding structure depends on the number of measurements being made on an integrated circuit and the various locations to be sampled or tested. Other than the pad structure or shield structure, there is no additional circuitry required on the integrated circuit to perform the present method. The measure instrument is generally connected to a probe or probing station.

Figure 16:
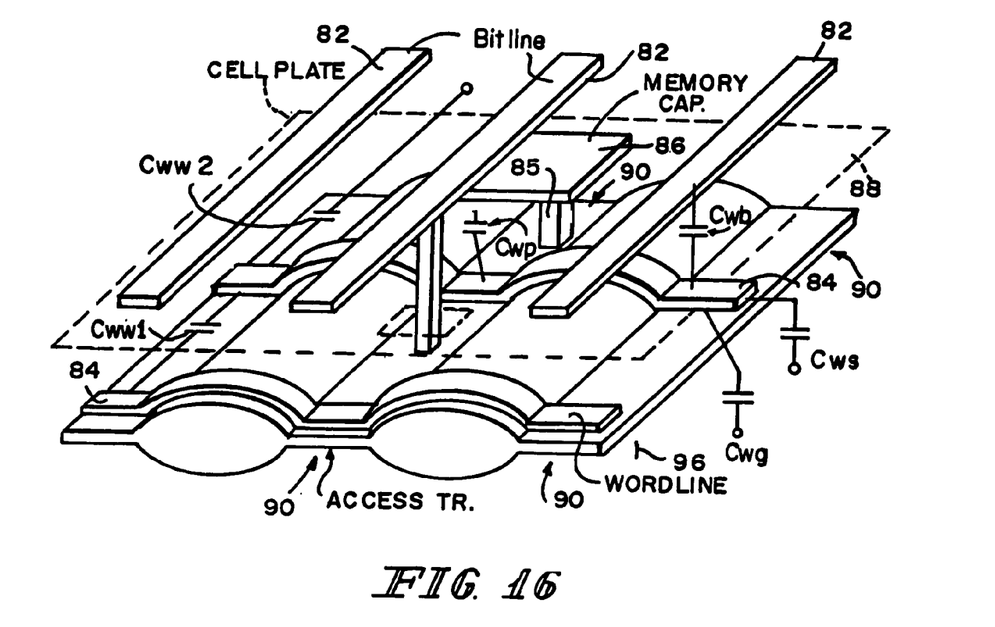
FIG. 16 is a perspective view of the ray of FIG. 10 in further detail and showing the capacitance with respect to a word line.
Figure 17:
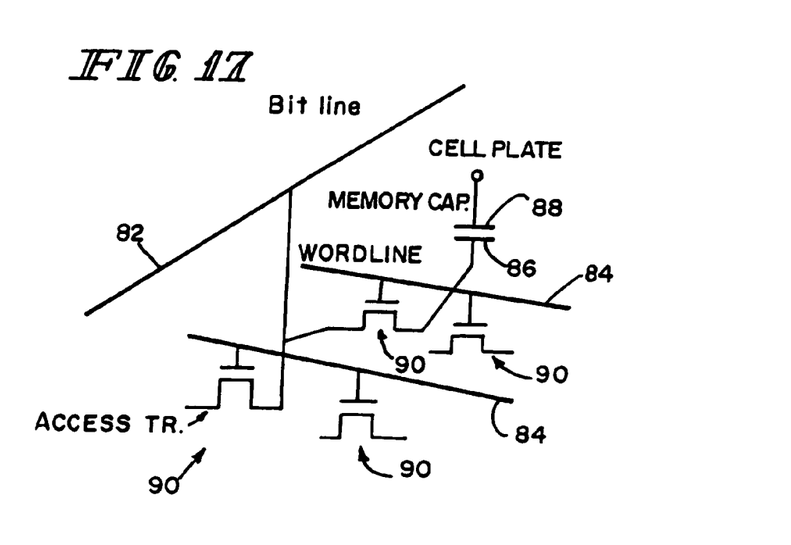
FIG. 17 is a schematic of FIG. 16.

Making the same measurements with respect to the word line is illustrated in FIGS. 16–21. Those elements having the same structure as that in FIGS. 10–15 have the same numbers. As illustrated in FIGS. 16 and 17, there are four illustrated access transistors 90, each are having its gate connected to a word line 84. Only a single bit line 82 is illustrated in the schematic 17 although three bit lines are illustrated in the remainder of the drawings. Other than the definition of the capacitors in FIG. 16, all of the structure will not be described in detail since it is similar to that in FIGS. 10–15.

The inter-word line capacitance is illustrated as Cww1 and Cww2. The third word line or second neighbor word line 84 is not illustrated in the Figures. The capacitance between the word line 84 and the cell plate 88 is Cwp. The capacitance between the word line and the bit line is not illustrated since they are separated by the capacitor plate 88 and therefore do not exist. The capacitance between the word line 84 and the bulk, well or substrate 96 is Cwg. The junction capacitance of the word line driver transistor, namely the row decoder loading is represented by Cws.

Figure 18:
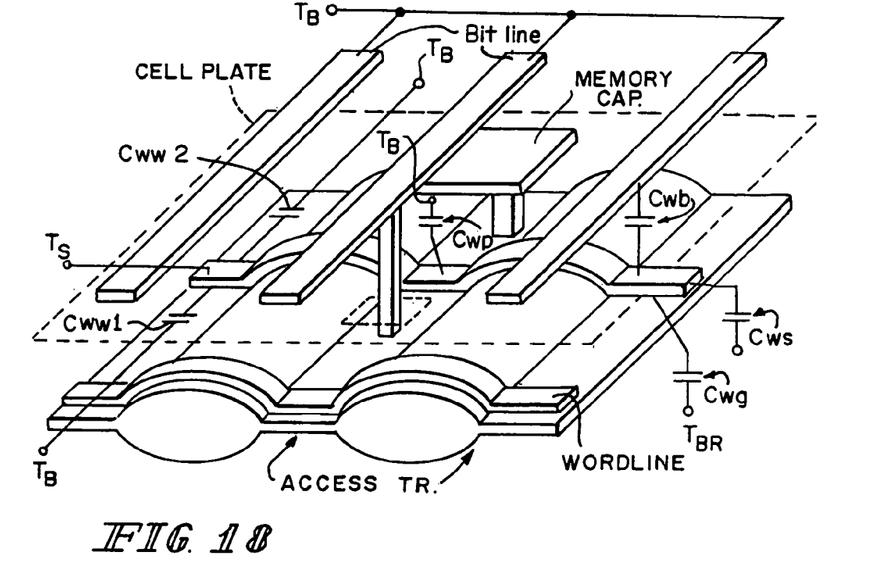
FIG. 18 shows the measurement for the capacitance between all of the capacitances with respect to a word line.

The measuring of the total capacitance with respect to one of the word lines 84 is illustrated in FIG. 18. The word line 84 under consideration is connected to the sense terminal $T_S$. All of the other terminals in the circuit are connected to a biasing terminal $T_B$. As discussed previously with the body or bulk 96 is connected to a biasing voltage $T_{BR}$ or which reverse biases the body with respect to the source and drains to produce the junction capacitance. Thus, the total capacitance sensed includes the sum of the capacitance between the adjacent board line Cww1 and Cww2, the capacitance between the word line and the cell plate Cwp, the capacitance between the word line and the bulk Cwg and the junction capacitance of the word line driver transistor Cws. As in the bit line, the word line drive transistor and the access transistors are all turned off.

Figure 19:
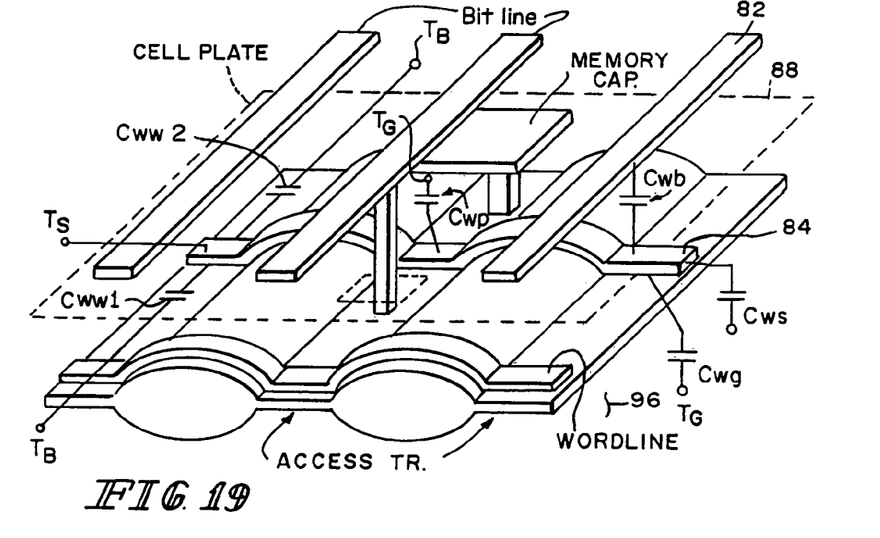
FIG. 19 shows the measuring of the capacitance between neighboring word lines.

Measuring the capacitance between the word line 84 and both of its neighboring word lines is illustrated in FIG. 19. Only of one the neighboring word lines is shown. The center word line 84 is connected to the sense terminal $T_S$ and the neighboring word lines are connected to the biasing terminal $T_B$. The cell plate 88 and the body or bulk 96 are both connected to the guard terminal $T_G$ which has the same voltage as the sense terminal $T_S$. Thus, the resulting measurement is of the capacitance between the pair of neighboring word line Cww1 and Cww2 and the drive transistor junction capacitance Cws.

Figure 20:
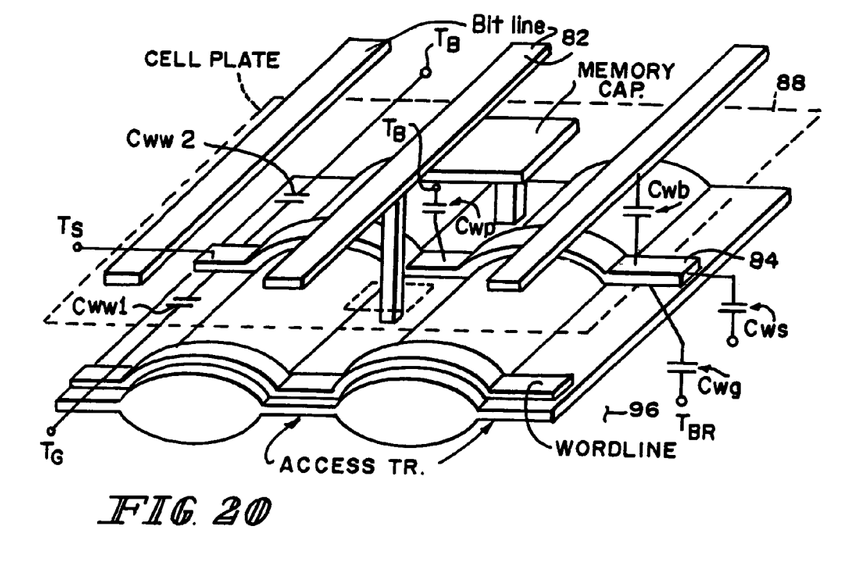
FIG. 20 shows measuring the capacitances between a pair of word lines.

To eliminate one of the neighboring word lines from the total capacitance is illustrated in FIG. 20. The sense terminal TS is connected to one of the word lines 84. One of the neighboring bit lines is connected to the biasing terminal $T_B$ as are the other word line, the cell plate 88 and the bulk 96. The other word line is connected to the guard terminal $T_G$ which has the same voltage as the sensor terminal $T_S$. The resulting measurement would be the capacitance between the two word lines Cww2, between the word line and the cell plate Cwp, the junction capacitance between the word line and the bulk Cwg and the junction capacitor of the word line driver Cws.

Figure 21:
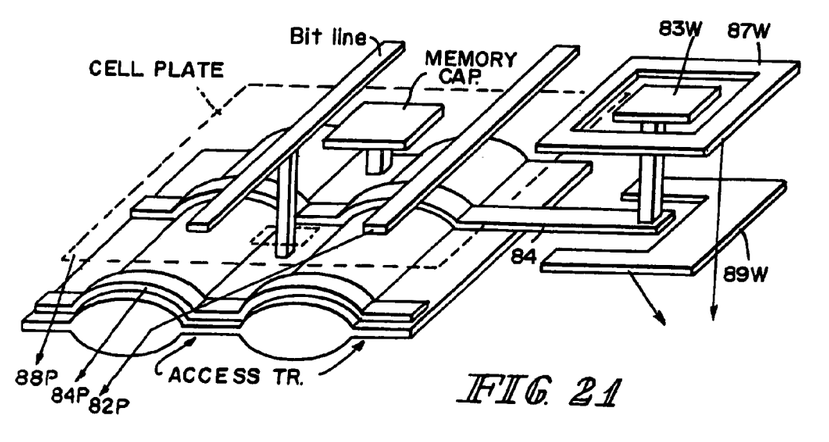
FIG. 21 shows the pad and shielding structure of a bit line.

FIG. 21 illustrates the additional structure which is provided for access to the word line 84. As with respect to FIG. 15 for the bit line, there is a sense pad 83W which is on the top metal layer connected to the word line 84. It is surrounded by a close shield 87W. On a lower metal layer at the same level as the word line 84 is a U-shaped shield plate 89W. Independent access to the word lines at pad 82P, the adjacent word lines at 84P and the cell plate at 88P are also illustrated by the arrows.

Figures 22, 23:
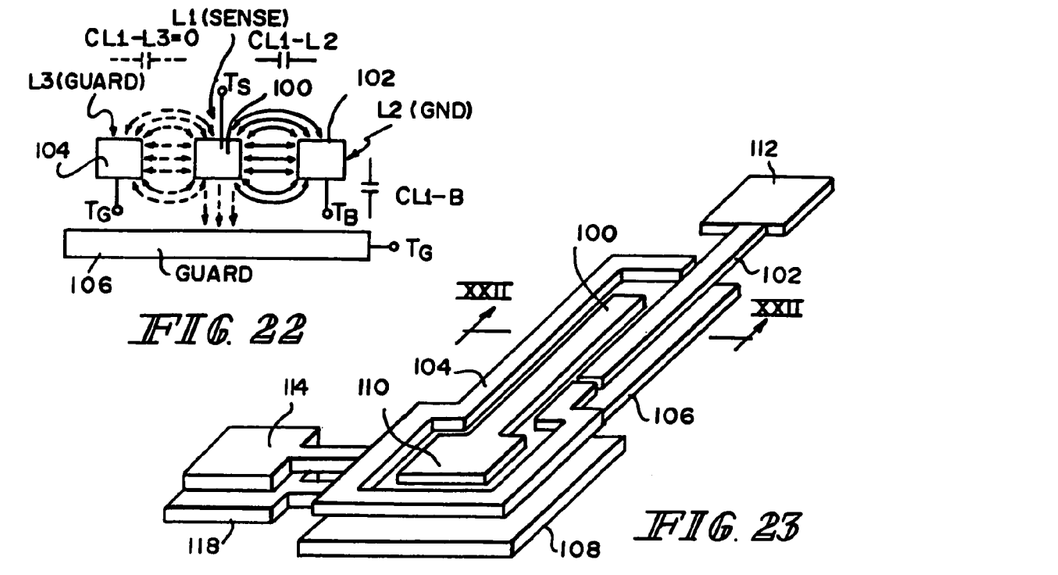
FIG. 22 shows a cross section along lines XXII—XXII of FIG. 23 for measuring the capacitance between two lines in a common plane.
FIG. 23 is a perspective view of FIG. 22.

A further example is a measurement of capacitance between wire lines, conductors or interconnects on the same plane or different planes of an integrated circuit. The capacitance between a wire and another wire is performed by connecting one of the wires to a sense terminal $T_S$ and the other wire to a bias terminal $T_B$, for example, a ground. All those wires in the integrated circuit, which would produce, a parasitic capacitance and that are not to be included, are connected to a guard terminal which has the same voltage value as that of the sensing terminal. To measure the capacitance between line L1 and L2 is illustrated in FIGS. 22 and 23. The sense terminal $T_S$ is connected to line L1 100 and ground or a bias terminal $T_B$ is connected to line L2 102. The other adjacent line L3 104 is connected to a guard terminal and the wire interconnect at a lower level 106, is also connected to a guard voltage $T_G$.

As is illustrated in FIG. 23, the wire 100 includes a contact pad 110. The line 104 surrounds contact pad 110 and is parallel to the line 100 and includes a contact terminal 114. The second line L2 is illustrated as 102 parallel to and in the same plane as the line 100 and includes a pad 112. A guard plate 108 extends below the lines 100, 102 and 104 as well as the contact pad 110 and includes the terminal pad 118. The line 102 is not connected to the line 104.

Figures 24, 25:
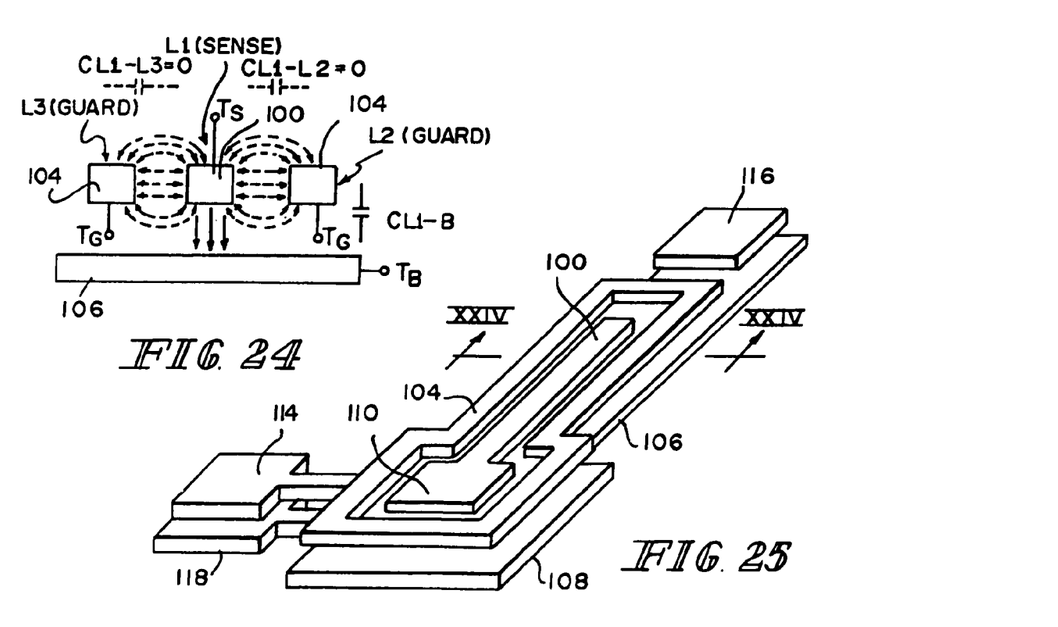
FIG. 24 illustrates the cross section along lines XXIV—XXIV of FIG. 25 and illustrates the measuring of the capacitance between lines or interconnects on two different planes.
FIG. 25 is a perspective view of the structure of FIG. 24.

To measure the capacitance between levels or planes is illustrated in FIGS. 24 and 25. The line 100 is connected to a sense terminal $T_S$ and the lower line or plate 106 is connected to a biasing terminal $T_B$ or ground. The adjacent leads 104 are connected together and connected to a guard terminal $T_B$ which is the same voltage as the sense voltage $T_S$. Thus, the capacitance between the line 100 and the lower level of the linear pad 106 is measured. The line 100 and its pad 110 are surrounded by the lines 104. The lower level line 106 lies below the line 100 and includes a terminal 116 at the same level as the line 100 and lead 104. Plate 108 is disconnected from 106 and includes a terminal 118 connected to the guard terminal TG. This isolates the pad 110 of the line 100 from the remainder of the integrated circuit or circuit structure.

Figure 26:
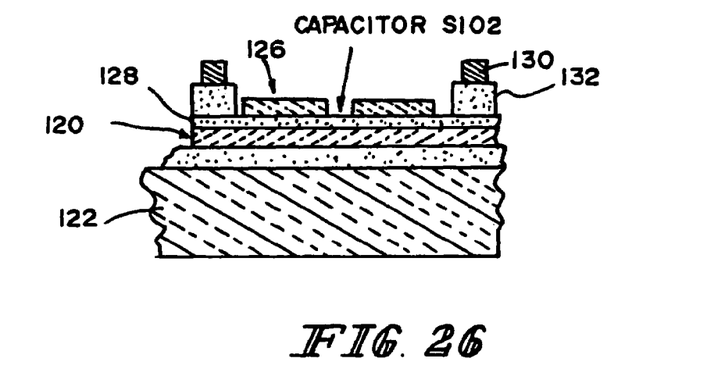
FIG. 26 is a cross sectional view of a capacitor array including two layers of polycrystalline silicon.
Figure 27:
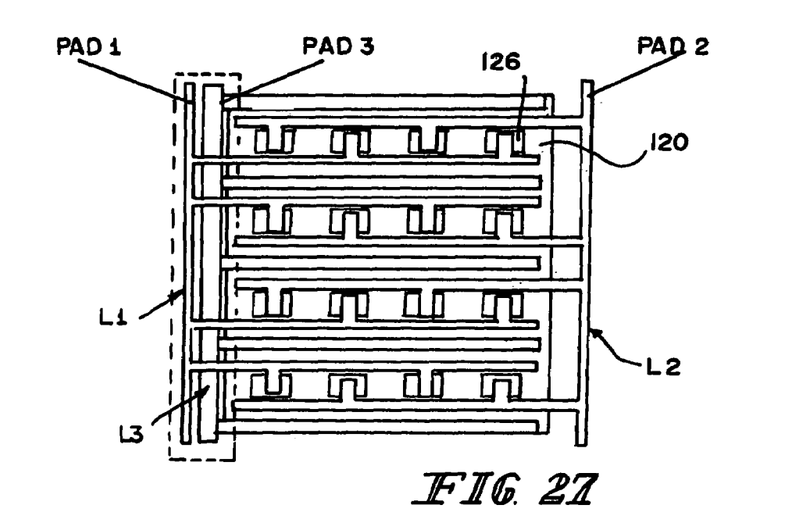
FIG. 27 is a plan view of FIG. 26.
Figure 28:
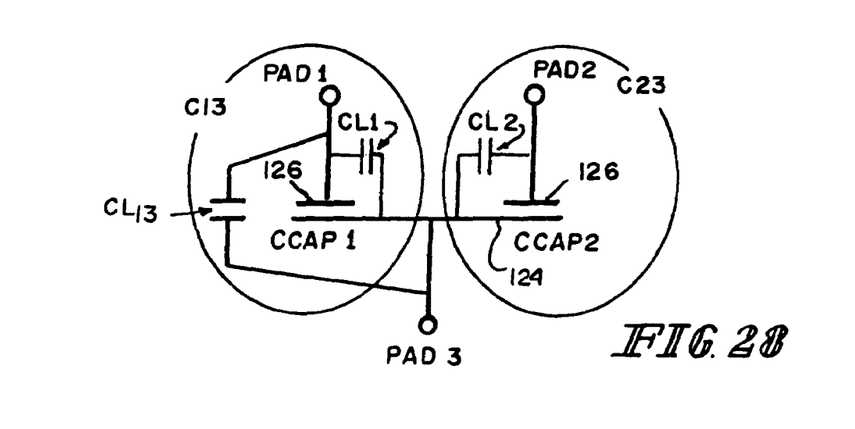
FIG. 28 is a schematic of FIG. 27.

The example previously considered included metal contacts and/or interconnect. The next example in FIGS. 26–28 illustrates polysilicon connectors and interconnects and measurements of the capacitance therebetween. A first layer of polysilicon 120 is separate from a substrate 122 by the field oxide 124. A second layer of polysilicon 126 is separated from the first layer of polysilicon 120 by oxide layer 128. A first metal layer 130 is separated from the oxide layer 128 by field oxide 132. Line L1 is connected to pad 1, line L2 is connected to pad 2 and line L3 is connected to pad 3. Line L1 is connected to one of the second level polysilicon 126 and line 2 is connected to the adjacent second level of polysilicon 126.

Figure 29:
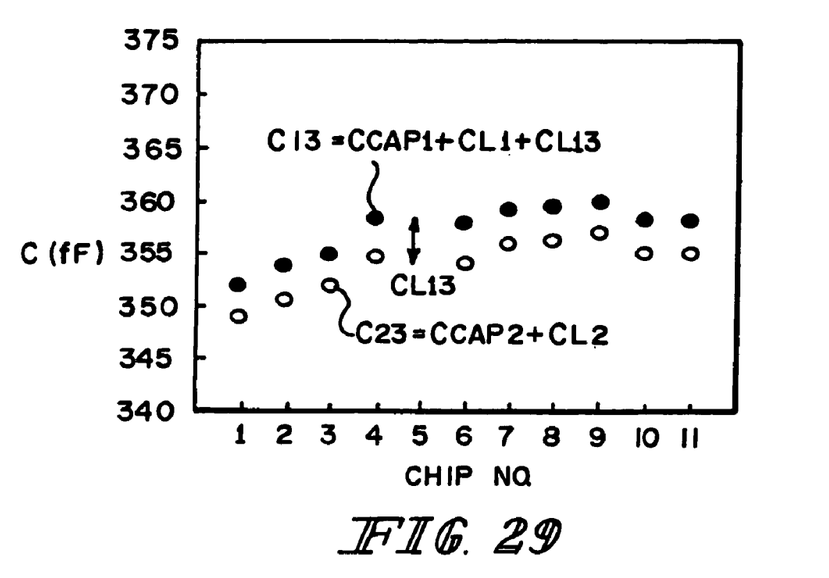
FIG. 29 is a graph of measured capacitance versus chip number.
Figure 30:
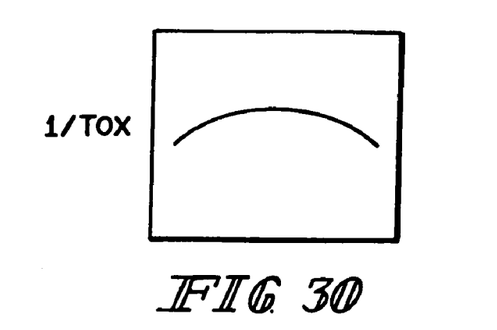
FIG. 30 is a graph of the chip number versus the capacitance.
Figure 31:
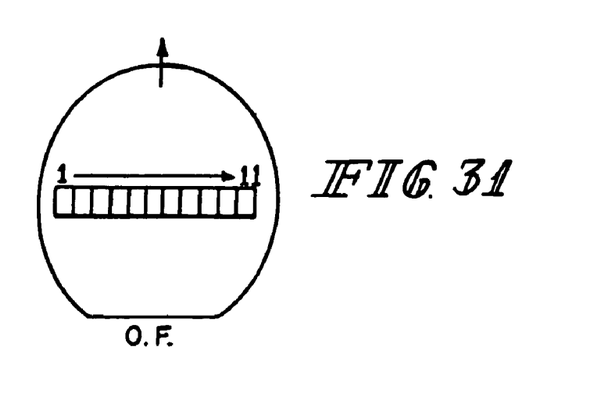
FIG. 31 is a view of the location of the chips on a wafer.

The resulting of capacitance are illustrated in FIG. 28. The capacitance between the second level of polysilicon 126 and the first level of polysilicon 120 is signified Ccap 1 and Ccap 2 for lines L1 and L2, respectively. The capacitance between the first line L1 and the second line L2 with the first level polysilicon 120 is signified by capacitance CL1 and CL2 respectively. The capacitance between L1 and L2 is signified by the capacitance CL13. The total capacitance between pads 1 and 2 is signified by C13 which includes the capacitance Ccap1, CL1 and CL13. The capacitance between pads 2 and 3 is signified by C23 which includes Ccap 2 and CL2. If the capacitance CL1 and CL2 are equal and the capacitance Ccap 1 and Ccap 2 are equal, the difference between the measurement between pads 1 and 3 and pads 2 and 3, should be the capacitance between lines 1 or 2, CL13. For each of the wires that overlap of a length of 41.2 microns, the capacitance CL13 has been calculated to be in the 2–3 femto-farad range. The measurements on eleven chips on a wafer is illustrated in FIGS. 29–31. The results show that the measured values for the capacitance CL13 is in the 2–3 femto-farad range.

In FIG. 30, the capacitance per chip position is graphed and is inversely proportional to the oxide thickness.

The present measurement method may be part of a method of producing integrated circuit. This method includes forming regions in a substrate, forming one or more of gates, contacts and interconnects separated from the substrate and each other by insulators, and enclosing the integrated circuit in a package with external terminals. The method further includes measuring capacitance of micro structures of the integrated circuit, wherein the micro structure has a first portion and a second portion separated by an insulator and the integrated circuit includes at least a third portion separated from the first portion by an insulator. The measuring step further includes applying a biasing voltage to the second portion; and applying the same potential to the first and third portions. An electrical characteristic between the first and second portions is measured to determine the capacitance between the first and second portions. The voltage and potential may be applied to external terminals connected to the respective regions. Internal terminals are provided connected to the respective regions. The voltage and potential may be applied to internal terminals prior to packaging.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of producing integrated circuit including forming regions in a substrate, forming one or more of gates, contacts and interconnects separated from the substrate and each other by insulators, and enclosing the integrated circuit in a package with external terminals; the method further comprising measuring capacitance of micro structures of the integrated circuit, wherein the micro structure has a first portion not connected to ground and a second portion separated by an insulator and the integrated circuit includes at least a third portion separated from the first portion by an insulator, the measuring step further comprising:
   applying a biasing potential to the second portion;
   applying a common potential to the first and third portions; and
   measuring at the first portion an electrical characteristic only between the first and second portions to determine the capacitance only between the first and second portions.

2. The method according to claim 1, wherein the biasing and common potentials are applied to external terminals connected to the respective regions.

3. The method according to claim 1, including providing internal terminals connected to the respective regions; and wherein the biasing and common potentials are applied to internal terminals prior to packaging.

* * * * *